(12) United States Patent
Steele

(10) Patent No.: US 7,907,007 B2
(45) Date of Patent: Mar. 15, 2011

(54) COMMUTATING AUTO ZERO AMPLIFIER

(75) Inventor: Andrew Steele, Sandbach (GB)

(73) Assignee: NXP B.V., Eindhoven (NL)

( * ) Notice: Subject to any disclaimer, the term of this patent is extended or adjusted under 35 U.S.C. 154(b) by 123 days.

(21) Appl. No.: 12/447,278

(22) PCT Filed: Oct. 19, 2007

(86) PCT No.: PCT/IB2007/054259
§ 371 (c)(1),
(2), (4) Date: Apr. 27, 2009

(87) PCT Pub. No.: WO2008/050270
PCT Pub. Date: May 2, 2008

(65) Prior Publication Data
US 2010/0045378 A1    Feb. 25, 2010

(30) Foreign Application Priority Data
Oct. 27, 2006  (EP) ..................... 06123116

(51) Int. Cl.
*H03F 1/02*    (2006.01)

(52) U.S. Cl. .............................................. 330/9; 330/51
(58) Field of Classification Search ................ 330/9, 51, 330/69; 327/124, 307
See application file for complete search history.

(56) References Cited

U.S. PATENT DOCUMENTS

| | | | |
|---|---|---|---|
| 3,988,689 A | 10/1976 | Ochi et al. | |
| 6,087,897 A | 7/2000 | Wang | |
| 6,476,671 B1 * | 11/2002 | Tang | 330/9 |
| 6,498,530 B1 | 12/2002 | Tang | |
| 7,336,124 B2 * | 2/2008 | Kasai et al. | 330/9 |
| 2006/0197574 A1 | 9/2006 | Naviasky et al. | |

* cited by examiner

*Primary Examiner* — Khanh V Nguyen

(57) ABSTRACT

A commutating auto zero amplifier system, comprises a first amplifier (A1), a second amplifier (A2) and a switching arrangement which defines a two phase operation, with one amplifier in an output mode providing the output and the other amplifier in a zeroing mode during each phase. A capacitor arrangement (Cof1. Cot1) stores offset voltages, a buffer amplifier (B) couples the output from the amplifier in the output mode to an input of the amplifier in the zeroing mode. This eliminates voltage swings at the output of an amplifier as it switches between modes of operation.

16 Claims, 3 Drawing Sheets

COMMUTATING AUTO ZERO AMPLIFIER

The present invention generally relates to electrical amplifiers, and particularly to commutating auto zero amplifiers.

There are various applications in which there is a need for a low offset amplifier, for example as part of a current sensing circuit.

One typical target specification for amplifiers of this type is a low systematic offset voltage, for example below 1 μV. Typically, integrated circuit amplifiers are formed using CMOS technology, and this level of offset is below the level which can be achieved by matching CMOS devices based on the processes used to produce the circuit.

Indeed, one of the biggest challenges in designing a precision CMOS operational amplifier is reducing the errors arising from mismatches in MOS transistors. There have been many approaches that can be taken that reduce these errors to a minimum, each different approach has its advantages but all have limitations. Existing systems are in three main classes:

1 Chopper Amplifier

These systems offer very low noise and systematic offsets. However, they require very high frequency clocks for a usable frequency response. Therefore they may not be suitable in a variety of applications, including current measurement applications.

2 Continuous Time Auto-Zero

These system offer low noise and systematic offsets. The system operates by having two amplifiers—a main amplifier and a nulling amplifier. These amplifiers are implemented as op-amps, and they act in series to zero out the offset but are two stage systems. This means they have reduced phase margin when compared to single stage op-amps making the systems unsuitable for a variety of applications, including current measurement applications.

3 Commutating Auto-Zero

The main benefit is the signal is only ever processed by one op-amp at a time. This means the response of the system is similar to a single stage amp. However these amplifiers have poor noise performance. The single stage stability of the system is ideal for a current measurement function, but the noise performance of the system is a limitation.

Of these three classes of zero-offset amplifier, only the commutating auto-zero application would be suitable in a current measurement application.

This invention thus relates specifically to commutating auto-zero amplifiers, and aims to improve existing designs.

According to the invention, there is provided a commutating auto zero amplifier system, comprising:

a first amplifier;

a second amplifier;

a switching arrangement which defines a two phase operation, with one amplifier in an output mode providing the output and the other amplifier in a zeroing mode during each phase;

a capacitor arrangement for storing offset voltages; and a buffer amplifier for coupling the output from the amplifier in the output mode to an input of the amplifier in the zeroing mode.

This amplifier minimizes switching noise and makes offset cancellation more accurate due to better matched impedances. This is of particular interest for circuits using analogue CMOS switches.

The buffer amplifier controls the operating point of the zeroing amplifier such that voltage swings are eliminated at the output of an amplifier when it is switching between an output mode and a zeroing mode.

The invention enables minimization of the limitations of auto zeroing commutating amplifiers, particularly output switching noise and systematic offset voltage, by the use of a buffer amplifier which feeds back the output voltage of the output mode amplifier to the zeroing mode amplifier.

Preferably the first and second amplifiers each have first and second differential inputs. The first differential inputs can be connected by the switching arrangement to the main differential inputs to the system. In this way, the first differential inputs can function as the main inputs for an amplifier in output mode. The second differential inputs can be connected to opposite ends of an offset storage capacitor network. The second differential inputs thus provide the calibration function.

When one of the first and second amplifiers is in the zeroing mode, a single one of the main differential inputs to the system is preferably provided to both input terminals of the first differential input. This means the operating point of the amplifier in the zeroing mode is close to the operating point where the amplifier will be used. As offset varies with input voltage level, this improves the system performance.

When one of the first and second amplifiers is in the zeroing mode, one of the input terminals of the second differential input may be coupled to the output of that amplifier, and the other is coupled to the output from the amplifier in the output mode by the buffer amplifier, and an offset voltage is stored in the capacitor arrangement.

The capacitor arrangement may comprise a first pair of series capacitors associated with the first amplifier, and a second pair of series capacitors associated with the second amplifier, and wherein the junctions between capacitors of the first pair and the second pair are connected together. This provides a common mode between the two main amplifiers.

The switching arrangement may comprise a plurality of switches each of which has a gate signal controlled by one of two phase control signals.

The system of the invention is particularly suitable for implementation as a CMOS IC.

The invention also provides a method of operating a commutating auto zero amplifier system, comprising:

in a first phase, using a first amplifier to provide an output, using a buffer amplifier to couple the output from the first amplifier to the input of a second amplifier, and zeroing the second amplifier by storing offset voltages in a capacitor arrangement; and in a second phase, using the second amplifier to provide an output, using the buffer amplifier to couple the output from the second amplifier to the input of the first amplifier, and zeroing the first amplifier by storing offset voltages in the capacitor arrangement.

Examples of the invention will now be described in detail with reference to the accompanying drawings, in which:

FIG. 1 shows an existing Commutating Auto Zero amplifier.

The circuit comprises two amplifiers, A1 and A2, each independently switchable by output switches to the output. Each amplifier has a capacitor Cof1 and Cof2 for storing an offset voltage to be applied to the non-inverting terminal of the amplifier. The two inputs A and B define the non-inverting (plus) and inverting (minus) main inputs.

The operation is in two main phases, with each phase connecting and disconnecting the various CMOS switches.

As shown, there are two control signals for the gates of the CMOS transistors—Ø1 and Ø2.

In this way, the circuit switches between modes in which one op-amp is connected to the output (known as an "output mode" or an "In loop mode") and the other op-amp is in offset calibration mode (known as "zeroing mode").

When in In-Loop output mode (Ø1 for A1 and Ø2 for A2), one input is coupled to the inverting input and the other is coupled to the input side of the offset capacitor.

During the offset calibration mode (Ø2 for A1 and Ø1 for A2) the offset is stored on the capacitors, then during the In-Loop phase this offset is switched on to the terminal of the amplifier, therefore canceling out the offset. Existing Commutating Auto Zero amplifiers are limited in their performance because of the noise that this switching presents on the output.

This output switching noise is made considerably worse because the input error voltage is independent of the output voltage. Therefore the output stage of each individual op-amp has to switch between the voltage at the input in order to correct the offset, then switch back to the voltage required at the output in order to close the loop round the amplifier. Due to device capacitances on the output of each op-amp, there will be a small period of settling time while the op-amps are being switched over into their new states.

This settling time will increase as the voltage inputs and output get further away from each other, as the op-amp needs longer to drive its output to the correct level.

This does not affect the op-amp in calibration/zeroing mode as the amplifier is switched out of the overall system. However, for the amplifier that is being switched back in to the overall system, the difference between its two outputs (Calibration and In-loop) will appear directly at the output as noise. This noise will be many times worse than the systematic offset and will result in error spikes on the output.

These noise spikes occur every time the switching of the op-amp occurs. This will limit the performance of the system as the noise floor of the amplifier is now set by these spikes rather than the systematic offset.

Figure 1:
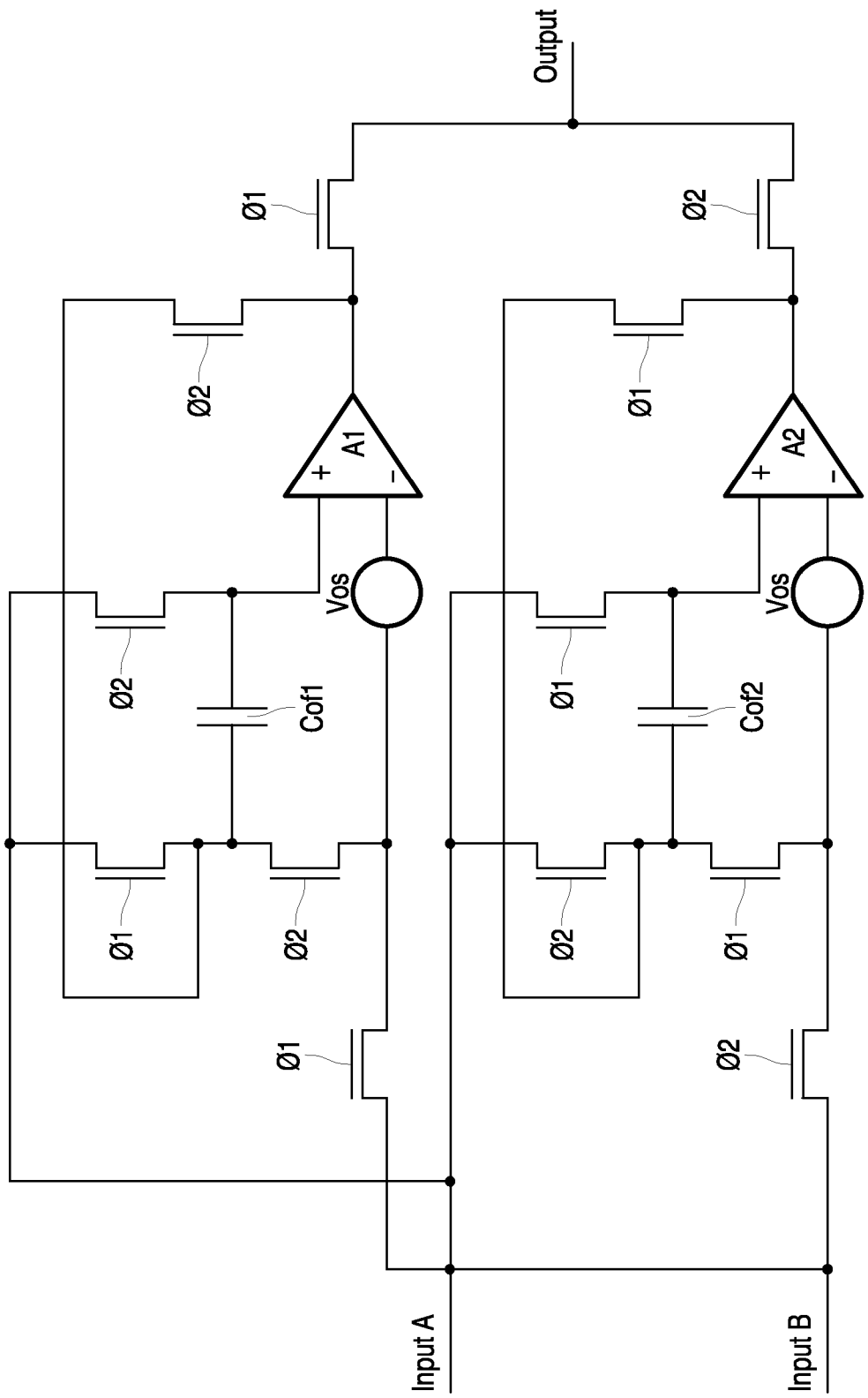
FIG. 1 shows a known a commutating auto zero amplifier.
Figure 2:
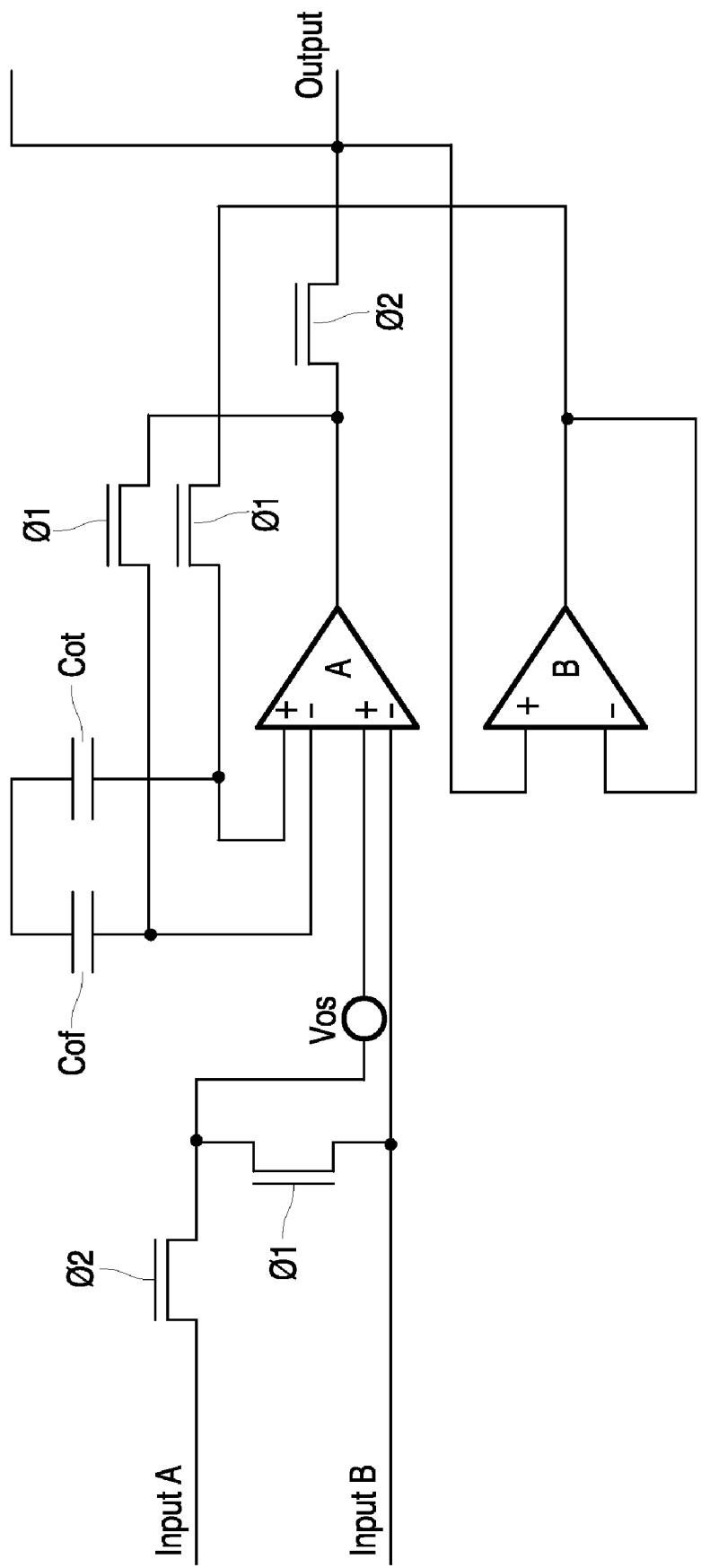
FIG. 2 shows a portion of a commutating auto zero amplifier of the invention.

FIG. 2 shows the principle of operation of the system of the invention.

FIG. 2 shows only one half of the system. The amplifier A is switchable between an output mode and a calibration mode, and during the calibration mode, another amplifier (not shown in FIG. 2) performs the output function.

The advantages of this new zero offset design can be explained by looking at the one half of the system shown in FIG. 2. The features of interest are in the zeroing and switching back of each op-amp. As in all commutating auto zero amplifiers, the system alternates between which amplifier is in use. While one is being used the other is being calibrated.

The main amplifier A shown in FIG. 2 has two differential inputs—one for the differential input from the main inputs A and B, and one for opposite ends of a capacitor arrangement of two capacitors Cof and Cot. The main inputs A and B are coupled to a main differential input of the amplifier A and the other two input terminals define a Trim differential input.

In system of FIG. 2, the calibration phase is carried out when the switches are set to Ø1. This causes both terminals of the main differential input of the main amplifier A to be connected to one input, Input B.

As the amplifier now has two sets of differential inputs, the output of the amplifier will drive its own inputs to set the point where the output is now at balance. At this point, the systematic offset has now been zeroed out and stored on the Capacitors. The offset voltage is stored as Cof-Cot.

The additional operational amplifier B has two roles. The first is that it buffers the output of the main amplifier in the other half of the commutating auto zero amplifier.

Thus, the amplifier B acts as a buffer to provide the current output voltage into the amplifier being calibrated/zeroed.

This therefore sets the non-inverting Trim input of op-amp A to the present In-loop output voltage from the other half of the amplifier system.

This therefore means that when one op-amp is being calibrated, the output from the calibrating amplifier is now tied close to the output voltage of the In loop op-amp. The means that difference between the present output and the calibrating op-amp output is only the offset of the amplifier, typically a few mV, which is added to the output of the calibrating amplifier to cancel out the offset.

This means that in the transition from Ø1 to Ø2, i.e. the transition of zeroing (calibrating) mode to output mode, the output is already at approximately the desired real output voltage. Therefore, the switching noise that is associated with a standard commutating auto-zero amplifier is eliminated. In the standard architecture, in this transition the output would have to swing through many volts.

The system however also remains a two-phase system, and no additional phases are needed. This keeps the switching of op-amps to a minimum.

Another advantage of this design is that the CMOS switches that connect that the differential offset storage capacitors see the same impedance load, if both Amplifier A and B are designed with similar output characteristics. Therefore, because the offset is differentially stored, any errors caused by charge injection of the CMOS switches will be cancelled out. This improves the systematic offset of the system as any charge injection error is now cancelled out.

The operation of one half of the commutating auto zero amplifier is explained above. The full system requires another identical circuit which works on the opposite phase. This means that while one circuit is calibrating the other is operating In-loop.

However, the whole system only needs one output following amplifier (amplifier B in FIG. 2). This is because the common mode for each amp is the same, and this is the present In loop output voltage.

Figure 3:
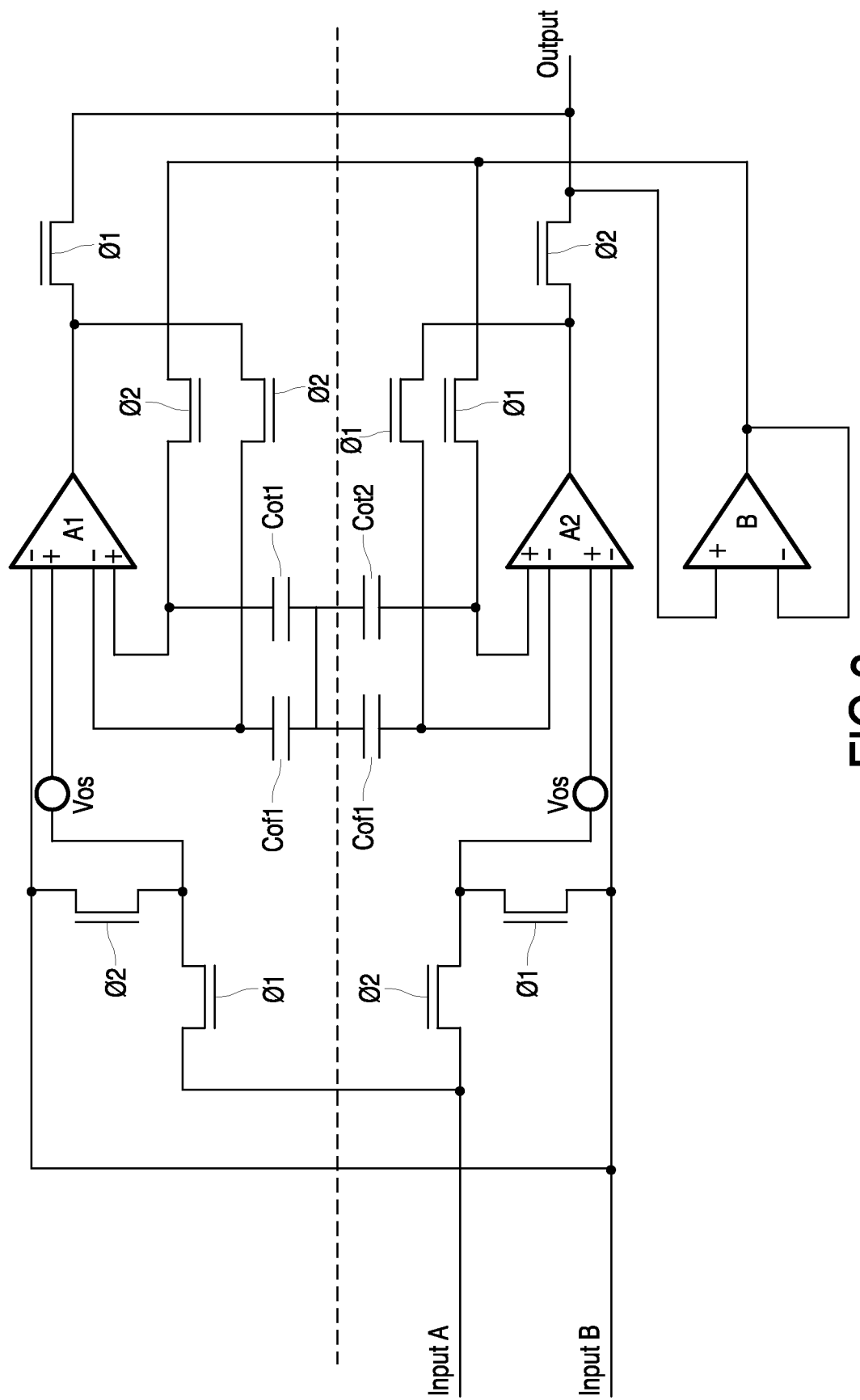
FIG. 3 shows one example of commutating auto zero amplifier of the invention.

FIG. 3 shows the complete system, and with a shared output-following amplifier B.

The system of the invention enables a number of advantages to be obtained:

The device will have substantially lower noise performance when compared with other Commutating Zero offset amplifiers.

The systematic offset will also be improved because the charge injection from the CMOS switches is better compensated.

The system offers noise and offset similar to that is achievable with continuous time auto-zero and chopper amplifier based systems. However, limitations of these designs are avoided, such as reduced phase margin and limited bandwidth.

One application of the invention is for proportional current measurement systems, for example automotive switches.

The invention enables a phase response of a single stage system to be obtained with a sub 1 µV response. In general terms, the invention provides a commutating auto zero amplifier with low output noise and improved accuracy. The invention is particularly appropriate for ICs designed for control systems required to work with great accuracy and to tolerate stability issues.

The system could be applied to many different applications. The overall offset and noise of the circuit compares well with existing Chopper and Continuous Time Auto-Zero amplifier system. However the circuit of the invention offers a simpler solution to existing systems using these designs.

Various other modifications will be apparent to those skilled in the art.

The invention claimed is:

1. A commutating auto zero amplifier system, comprising:
   a first amplifier;
   a second amplifier;
   a switching arrangement which defines a two phase operation, with the first amplifier in an output mode providing an output and the second amplifier in a zeroing mode during each phase;
   a capacitor arrangement for storing offset voltages; and
   a buffer amplifier for coupling the output from the first amplifier in the output mode to an input of the second amplifier in the zeroing mode.

2. A system as claimed in claim 1, wherein the first and second amplifiers each have first and second differential inputs.

3. A system as claimed in claim 2, wherein the first differential inputs are connected by the switching arrangement to main differential inputs to the system.

4. A system as claimed in claim 2, wherein the second differential inputs are connected to opposite ends of an offset storage capacitor network.

5. A system as claimed in claim 2, wherein when one of the first and second amplifiers is in the zeroing mode, a single one of the main differential inputs to the system is provided to both input terminals of the first differential input.

6. A system as claimed in claim 5, wherein when one of the first and second amplifiers is in the zeroing mode, one of the input terminals of the second differential input is coupled to the output of that amplifier, and the other is coupled to the output from the amplifier in the output mode by the buffer amplifier, and an offset voltage is stored in the capacitor arrangement.

7. A system as claimed in claim 1, wherein the capacitor arrangement comprises a first pair of series capacitors associated with the first amplifier, and a second pair of series capacitors associated with the second amplifier, and wherein the junctions between capacitors of the first pair and the second pair are connected together.

8. A system as claimed in claim 1, wherein the switching arrangement comprises a plurality of switches each of which has a gate signal controlled by one of two phase control signals.

9. A system as claimed in claim 1, implemented as a CMOS IC.

10. A method of operating a commutating auto zero amplifier system, comprising:
    in a first phase, using a first amplifier to provide an output, using a buffer amplifier to couple the output from the first amplifier to the input of a second amplifier, and zeroing the second amplifier by storing offset voltages in a capacitor arrangement; and
    in a second phase, using the second amplifier to provide an output, using the buffer amplifier to couple the output from the second amplifier to the input of the first amplifier, and zeroing the first amplifier by storing offset voltages in the capacitor arrangement.

11. A method as claimed in claim 10, wherein the first and second amplifiers each have first and second differential inputs.

12. A method as claimed in claim 11, wherein the first differential inputs are connected by the switching arrangement to main differential inputs to the system.

13. A method as claimed in claim 11, wherein the second differential inputs are connected to opposite ends of an offset storage capacitor network.

14. A method as claimed in claim 11, wherein when one of the first and second amplifiers is in the zeroing mode, a single one of main differential inputs to the system is provided to both input terminals of the first differential input.

15. A method as claimed in claim 14, wherein when one of the first and second amplifiers is in the zeroing mode, one of the input terminals of the second differential input is coupled to the output of that amplifier in zeroing mode, and the other one of the input terminals of the second differential input is coupled to the output from the amplifier in the output mode by the buffer amplifier, and an offset voltage is stored in the capacitor arrangement.

16. A method as claimed in claim 10, wherein controlling the system to switch between phases comprises controlling switches of a switching arrangement by one of two phase control signals.

* * * * *